United States Patent
Chen et al.

(10) Patent No.: US 12,557,632 B2
(45) Date of Patent: Feb. 17, 2026

(54) METHOD FOR FABRICATING AN INTERCONNECT STRUCTURE

(71) Applicant: UNITED MICROELECTRONICS CORP., Hsin-Chu (TW)

(72) Inventors: Shih-Cheng Chen, Tainan (TW); Ko-Wei Lin, Taichung (TW); Ying-Wei Yen, Miaoli County (TW); Chun-Ling Lin, Tainan (TW); Po-Jen Chuang, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 372 days.

(21) Appl. No.: 18/136,885

(22) Filed: Apr. 20, 2023

(65) Prior Publication Data

US 2024/0332189 A1 Oct. 3, 2024

(30) Foreign Application Priority Data

Mar. 28, 2023 (CN) .......................... 202310311732.1

(51) Int. Cl.
*H01L 23/532* (2006.01)
*H01L 21/768* (2006.01)

(52) U.S. Cl.
CPC .. *H01L 23/53238* (2013.01); *H01L 21/76843* (2013.01); *H01L 21/76877* (2013.01); *H01L 23/53266* (2013.01)

(58) Field of Classification Search
CPC ......... H01L 23/53238; H01L 23/53266; H01L 21/76843; H01L 21/76877; H01L 21/76883; H01L 21/76838; H01L 21/76864
See application file for complete search history.

(56) References Cited

U.S. PATENT DOCUMENTS

| | | | |
|---|---|---|---|
| 6,040,240 A | 3/2000 | Matsubara | |
| 6,518,183 B1 * | 2/2003 | Chang | H01L 21/76834 257/E21.582 |
| 6,562,712 B2 * | 5/2003 | Liu | H01L 21/76877 438/626 |
| 7,851,358 B2 * | 12/2010 | Wu | H01L 21/76883 257/E21.294 |
| 7,943,511 B2 | 5/2011 | Fang | |
| 11,929,326 B2 * | 3/2024 | Yang | H01L 23/53238 |
| 2021/0057335 A1 * | 2/2021 | Yang | H01L 23/5226 |

* cited by examiner

*Primary Examiner* — Dao H Nguyen
(74) *Attorney, Agent, or Firm* — Winston Hsu

(57) ABSTRACT

A method for fabricating an interconnect structure is disclosed. A substrate with a first dielectric layer is provided. A first conductor is formed in the first dielectric layer. A second dielectric layer is formed on the first dielectric layer. A trench is formed in the second dielectric layer to expose the top surface of the first conductor. An annealing process is performed on the top surface of the first conductor. The annealing process includes the conditions of a temperature of 400-450° C., duration less than 5 minutes, and gaseous atmosphere comprising hydrogen and nitrogen.

5 Claims, 2 Drawing Sheets

METHOD FOR FABRICATING AN INTERCONNECT STRUCTURE

BACKGROUND OF THE INVENTION

1. Field of the Invention

The invention relates to semiconductor technology, in particular to a manufacturing method of an interconnect structure, which can effectively improve the reliability of semiconductor back-end of line (BEOL) process.

2. Description of the Prior Art

Electromigration is the transport of material caused by the gradual movement of the ions in a conductor due to the momentum transfer between conducting electrons and diffusing metal atoms. Electromigration can cause the eventual loss of connections or failure of a circuit.

Electromigration is a key indicator of the reliability of the semiconductor back-end of line process. It usually depends on the metal conductor structural properties and the quality of the metal interface. For example, the grain boundaries of metal conductors, the formation of voids, and the content of impurities such as copper oxide may affect the reliability of metal conductors.

The prior art back-end metal processes usually involve a post-metal annealing process to mitigate electromigration. The existing technology requires lengthy processing time. Further, the annealing temperature is typically about 300° C. in order to avoid affecting the performance of the front-end devices. Therefore, larger grains cannot be formed in the metal conductor. Furthermore, the prior art method cannot solve the problem of impurities such as copper oxide in the metal conductor.

SUMMARY OF THE INVENTION

It is one object of the present invention to provide an improved method for fabricating an interconnect structure in order to solve the shortcomings or deficiencies of the prior art.

One aspect of the invention provides a method of fabricating an interconnect structure. A substrate having a first dielectric layer on the substrate and a first conductor in the first dielectric layer is provided. A second dielectric layer is formed on the first dielectric layer. A trench is formed in the second dielectric layer to expose a top surface of the first conductor. The top surface of the first conductor is then subjected to an anneal process with conditions including an annealing temperature of 400-450° C. for a time period of less than 5 minutes and a gas environment comprising hydrogen and nitrogen.

According to some embodiments, the annealing temperature is about 425° C. and the time period is about 180 seconds.

According to some embodiments, the first conductor comprises copper or tungsten.

According to some embodiments, the method further comprises the steps of depositing a barrier layer on the second dielectric layer and an interior surface of the trench; depositing a second conductor within the trench; and polishing the second conductor.

According to some embodiments, the second conductor comprises copper.

According to some embodiments, the barrier layer comprises titanium nitride.

The technical features of the present invention at least include: (a) shorter processing time (180 seconds), which can avoid affecting the performance of the front-end devices, and (b) higher annealing temperature (about 400-450° C.), such that larger crystal grains can be formed in the metal conductor. Further, the impurity problem such as copper oxide in the metal conductor can be solved.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
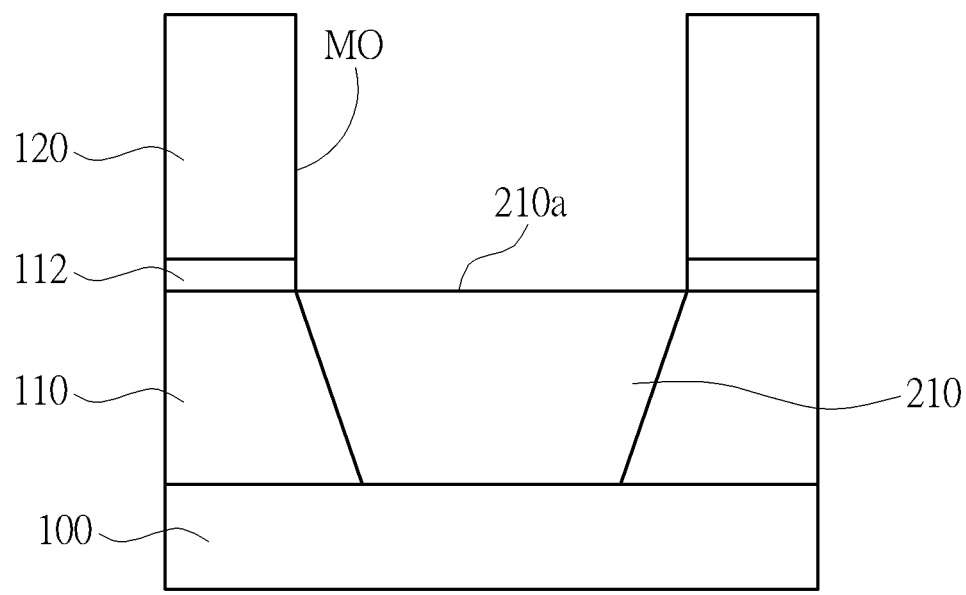
FIG. 1 to FIG. 4 are schematic diagrams showing a manufacturing method of an interconnect structure according to an embodiment of the present invention.

Please refer to FIG. 1 to FIG. 4, which are schematic diagrams showing a manufacturing method of an interconnect structure according to an embodiment of the present invention. As shown in FIG. 1, firstly, a substrate 100 is provided. For example, the substrate 100 may be a semiconductor substrate such as a silicon substrate. Next, a first dielectric layer, such as a low dielectric constant (low-k) material layer or a silicon oxide layer, is formed on the substrate 100. According to an embodiment of the present invention, the first dielectric layer 110 has a first conductor 210 therein. According to an embodiment of the present invention, for example, the first conductor 210 may be a copper damascene structure or tungsten metal, but is not limited thereto. According to an embodiment of the present invention, the first conductor 210 includes copper or tungsten.

Subsequently, a second dielectric layer 120 is formed on the first dielectric layer 110. For example, the second dielectric layer 120 may be a low dielectric constant material layer or a silicon oxide layer. According to an embodiment of the present invention, before forming the second dielectric layer 120, an etch stop layer or capping layer 112, such as a nitrogen-doped silicon carbide layer, may be formed first. A trench MO is then formed in the second dielectric layer 120 and the capping layer 112 using a photolithography process and an etching process to expose the top surface 210a of the first conductor 210.

Figure 2:
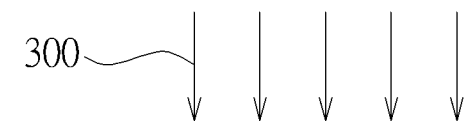
Figure 2:
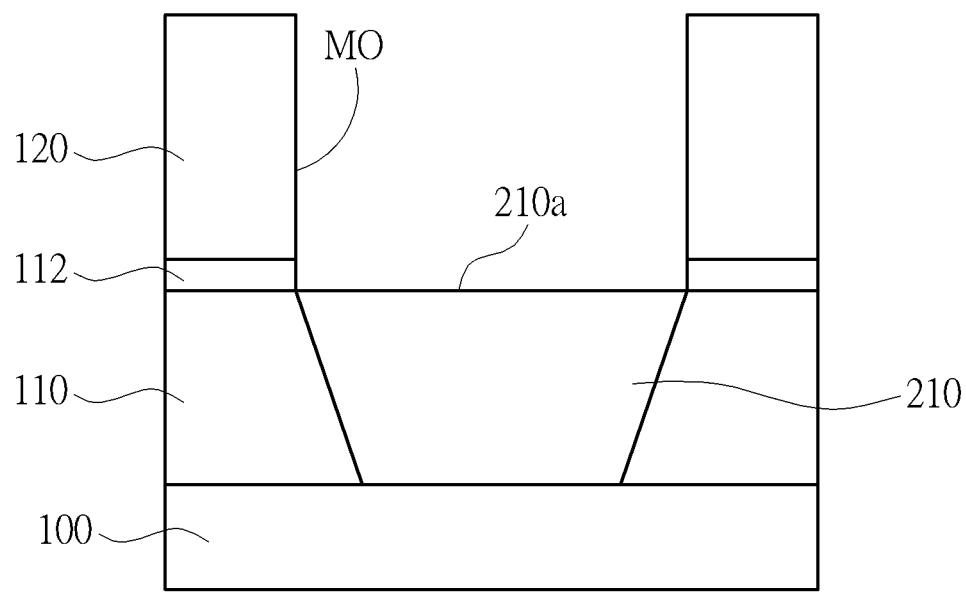

As shown in FIG. 2, an annealing process 300 is then performed on the top surface 210a of the first conductor 210 under conditions including an annealing temperature of 400-450° C. for less than 5 minutes, and a gas environment including hydrogen and nitrogen. According to an embodiment of the present invention, the hydrogen gas can reduce impurities such as copper oxide in the first conductor 210. According to an embodiment of the present invention, the above-mentioned annealing temperature is preferably 425° C., and the time period is preferably 180 seconds.

Figure 3:
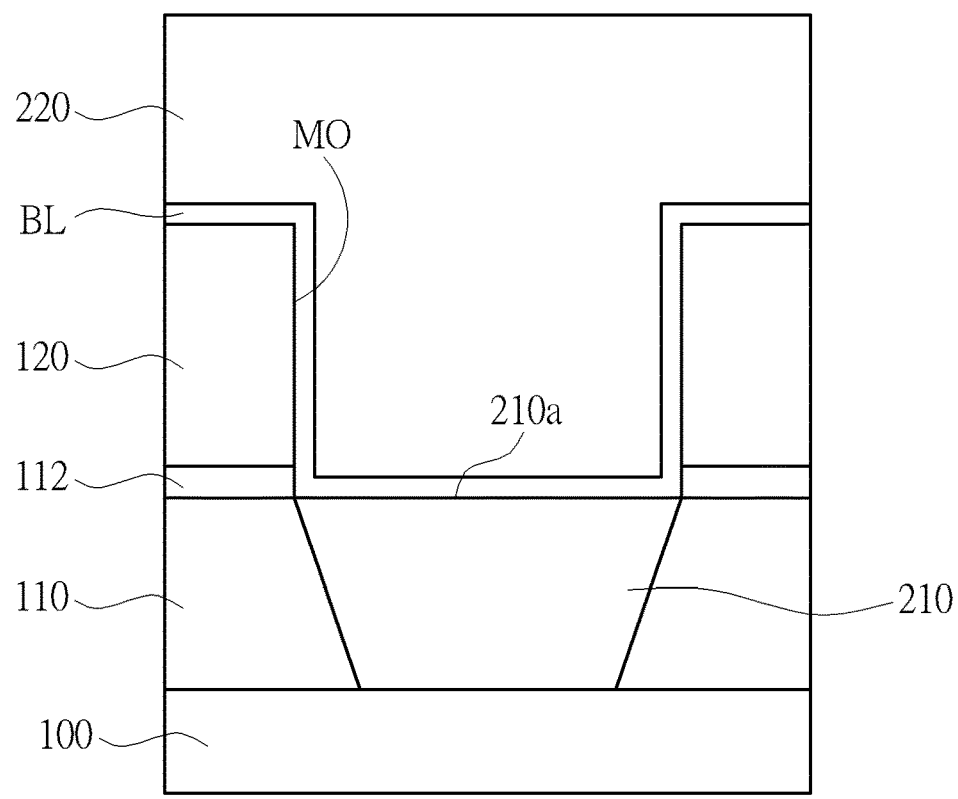

As shown in FIG. 3, subsequently, a barrier layer BL, such as titanium nitride or tantalum nitride, is conformally deposited on the second dielectric layer 120 and the inner surface of the trench MO. A second conductor 220 is then deposited in the trench MO using an electroplating process. According to an embodiment of the present invention, the second conductor 220 may include copper.

Figure 4:
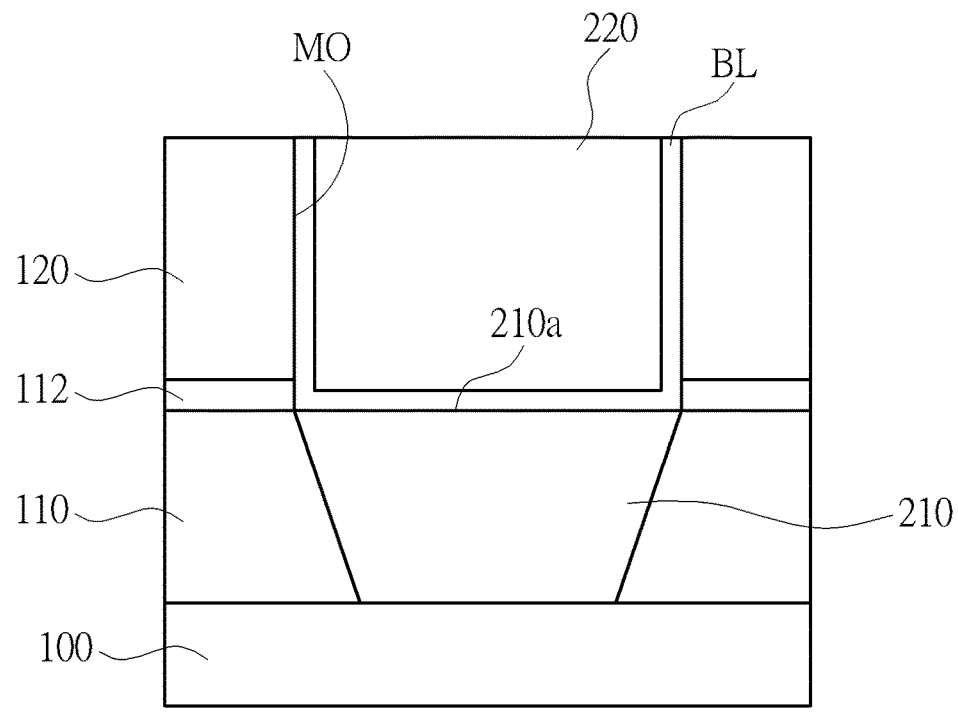

As shown in FIG. 4, next, a chemical mechanical polishing (CMP) process is performed to grind or polish the second conductor 220 until the surface of the second dielectric layer 120 is exposed.

The technical features of the present invention at least include: (a) shorter processing time (180 seconds), which can avoid affecting the performance of the front-end devices, and (b) higher annealing temperature (about 400-450° C.), such that larger crystal grains can be formed in the metal conductor. Further, the impurity problem such as copper oxide in the metal conductor can be solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating an interconnect structure, comprising:
   providing a substrate having a first dielectric layer on the substrate and a first conductor in the first dielectric layer;
   forming a second dielectric layer on the first dielectric layer;
   forming a trench in the second dielectric layer to expose a top surface of the first conductor;
   after forming the trench in the second dielectric layer, subjecting the top surface of the first conductor to an anneal process with conditions including an annealing temperature of 400-450° C. for a time period of less than 5 minutes and a gas environment comprising hydrogen and nitrogen;
   after performing the anneal process, depositing a barrier layer on the second dielectric layer and an interior surface of the trench;
   depositing a second conductor within the trench; and
   polishing the second conductor.

2. The method according to claim 1, wherein the annealing temperature is about 425° C. and the time period is about 180 seconds.

3. The method according to claim 1, wherein the first conductor comprises copper or tungsten.

4. The method according to claim 1, wherein the second conductor comprises copper.

5. The method according to claim 1, wherein the barrier layer comprises titanium nitride.

* * * * *